US006953698B2

(12) United States Patent
Casey et al.

(10) Patent No.: US 6,953,698 B2
(45) Date of Patent: Oct. 11, 2005

(54) METHODS FOR MAKING MICROWAVE CIRCUITS

(75) Inventors: John F. Casey, Colorado Springs, CO (US); Lewis R. Dove, Monument, CO (US); Ling Liu, Colorado Springs, CO (US); James R. Drehle, Colorado Springs, CO (US); R. Frederick Rau, Jr., Colorado Springs, CO (US); Rosemary O. Johnson, Colorado Springs, CO (US); Julius Botka, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/600,143

(22) Filed: Jun. 19, 2003

(65) Prior Publication Data

US 2004/0257194 A1 Dec. 23, 2004

(51) Int. Cl.[7] .......... H01L 21/66
(52) U.S. Cl. .......... 438/15; 438/18; 257/E21.531
(58) Field of Search .......... 438/14–15, 17–18, 438/FOR 102; 257/E21.531

(56) References Cited

U.S. PATENT DOCUMENTS 3,808,042 A 4/1974 Dietz
4,303,480 A 12/1981 Wood et al.
4,806,941 A 2/1989 Knochel et al.
4,808,274 A 2/1989 Nguyen
5,910,334 A 6/1999 Lautzenhiser et al.
6,255,730 B1 7/2001 Dove et al.
6,420,778 B1 * 7/2002 Sinyansky .......... 257/664
6,457,979 B1 10/2002 Dove et al.
2001/0012692 A1 8/2001 Miller et al.
2004/0023482 A1 * 2/2004 Dell'Ova et al. .......... 438/617

FOREIGN PATENT DOCUMENTS

JP 03006818 A * 1/1991 .......... H01L/21/302

OTHER PUBLICATIONS

John F. Casey, et al., "Methods for Depositing a Thickfilm Dielectric on a Substrate", New Patent Application (9 pages of specification, 4 pages of claims and 1 page abstract), 2 sheets of formal drawings, Filed Jun. 19, 2003.

John F. Casey, et al., "Methods for Forming a Conductor on a Dielectric", New Patent Application (12 pages of specification, 3 pages of claims and 1 page abstract), 2 sheets of formal drawings , Filed Jun. 19, 2003.

Wolf, et al., "Silicon Processing for the VLSI ERA", vol. 1: Process Technology, Lattice Press, 1986, pp. 531–535.

* cited by examiner

*Primary Examiner*—George Fourson
*Assistant Examiner*—Thanh V. Pham

(57) ABSTRACT

Disclosed are methods for making microwave circuits using thickfilm components, the thickfilm components including: a first, multi-layer thickfilm dielectric deposited on a ground plane; a thickfilm conductor deposited on the first thickfilm dielectric; a second, multi-layer thickfilm dielectric deposited on the first dielectric and conductor to encapsulate the conductor; a thickfilm ground shield layer deposited over the first and second dielectrics; and thickfilm resistors deposited in close proximity to the first and second dielectrics.

8 Claims, 9 Drawing Sheets

METHODS FOR MAKING MICROWAVE CIRCUITS

CROSS-REFERENCE TO RELATED APPLICATIONS

This application is related to the application of John F. Casey, et al. entitled "Methods for Forming a Conductor on a Dielectric", filed on the same date as this application; and to the application of John F. Casey, et al. entitled "Methods for Depositing a Thickfilm Dielectric on a Substrate", also filed on the same date as this application. These applications are hereby incorporated by reference for all that they disclose.

BACKGROUND

Microwave circuits have traditionally been built using individual thinfilm components (e.g., microstrips or bent microstrips) that are then assembled with one or more active circuit die into a machined metal package that is commonly referred to as "a gold brick". These machined packages often make up a substantial fraction of the cost of the final completed circuit. For simpler brick machining and improved impedance matching, the thinfilm components are ideally the same thickness as the die itself. However, high frequency microwave circuits translate to high power . . . high power translates to high heat dissipation . . . high heat dissipation translates to very thin die . . . thin die translate to thin, thinfilm components . . . thin, thinfilm components translate to fragile substrates . . . and fragile substrates translate to low-yield, high-cost processing.

SUMMARY OF THE INVENTION

One aspect of the invention is embodied in a first method for making a microwave circuit. The method comprises depositing a thickfilm dielectric over a ground plane, and then forming a conductor on the thickfilm dielectric. The thickfilm dielectric is deposited over the ground plane by depositing a first layer of thickfilm dielectric on the ground plane, and then air drying the first layer to allow solvents to escape, thereby increasing the porosity of the first layer. The first layer is then oven dried. Thereafter, additional layers of thickfilm dielectric are deposited on top of the first layer, with each layer being oven dried after it is deposited. The deposited layers are then fired.

Another aspect of the invention is embodied in a second method for making a microwave circuit. The method comprises depositing a dielectric over a ground plane, and then forming a conductor on the dielectric. The conductor is formed by depositing a conductive thickfilm on the dielectric and then "subsintering" the conductive thickfilm. Either before or after the subsintering, the conductive thickfilm is patterned to define at least one conductor. After subsintering, the conductive thickfilm is etched to expose the conductor (s), and the conductor(s) are then fired at a full sintering temperature.

An additional aspect of the invention is embodied in a third method for making a microwave circuit. The method comprises depositing a first dielectric over a ground plane, and then forming a conductor on the first dielectric. The impedance of the conductor is then measured and used along with a desired impedance to solve an equation for a dry print thickness of a second, thickfilm dielectric. The second, thickfilm dielectric is then deposited over the conductor and first dielectric, thereby encapsulating the conductor between the first and second dielectrics. Thereafter, a ground shield layer is deposited over the first and second dielectrics.

Yet another aspect of the invention is embodied in a fourth method for making a microwave circuit. The method comprises depositing a first dielectric over a ground plane, and then forming a conductor on the first dielectric. A second dielectric is then deposited over the conductor and first dielectric, thereby encapsulating the conductor between the first and second dielectrics. Finally, a ground shield layer is formed over the first and second dielectrics by 1) precoating the first and second dielectrics with a metallo-organic layer, and then 2) depositing a thickfilm ground shield layer over the precoat layer.

A final aspect of the invention is embodied in a fifth method for making a microwave circuit. The method comprises depositing a first dielectric over a ground plane, and then forming a conductor on the first dielectric. A second dielectric is then deposited over the conductor and first dielectric, thereby encapsulating the conductor between the first and second dielectrics. Finally, a ground shield layer is formed over the first and second dielectrics by 1) placing a polymer screen over the first and second dielectrics, and applying pressure to the polymer screen until it at least partially conforms to a contour of the dielectrics, and then 2) printing a thickfilm ground shield layer through the polymer screen.

Other embodiments of the invention are also disclosed.

BRIEF DESCRIPTION OF THE DRAWING

Illustrative embodiments of the invention are illustrated in the drawings, in which.

DETAILED DESCRIPTION OF THE INVENTION

FIGS. 1, 6, 10, 13 & 15 illustrate various methods for making microwave circuits. As will become clear from reading the following description, the methods may be combined in various ways.

Figure 1:
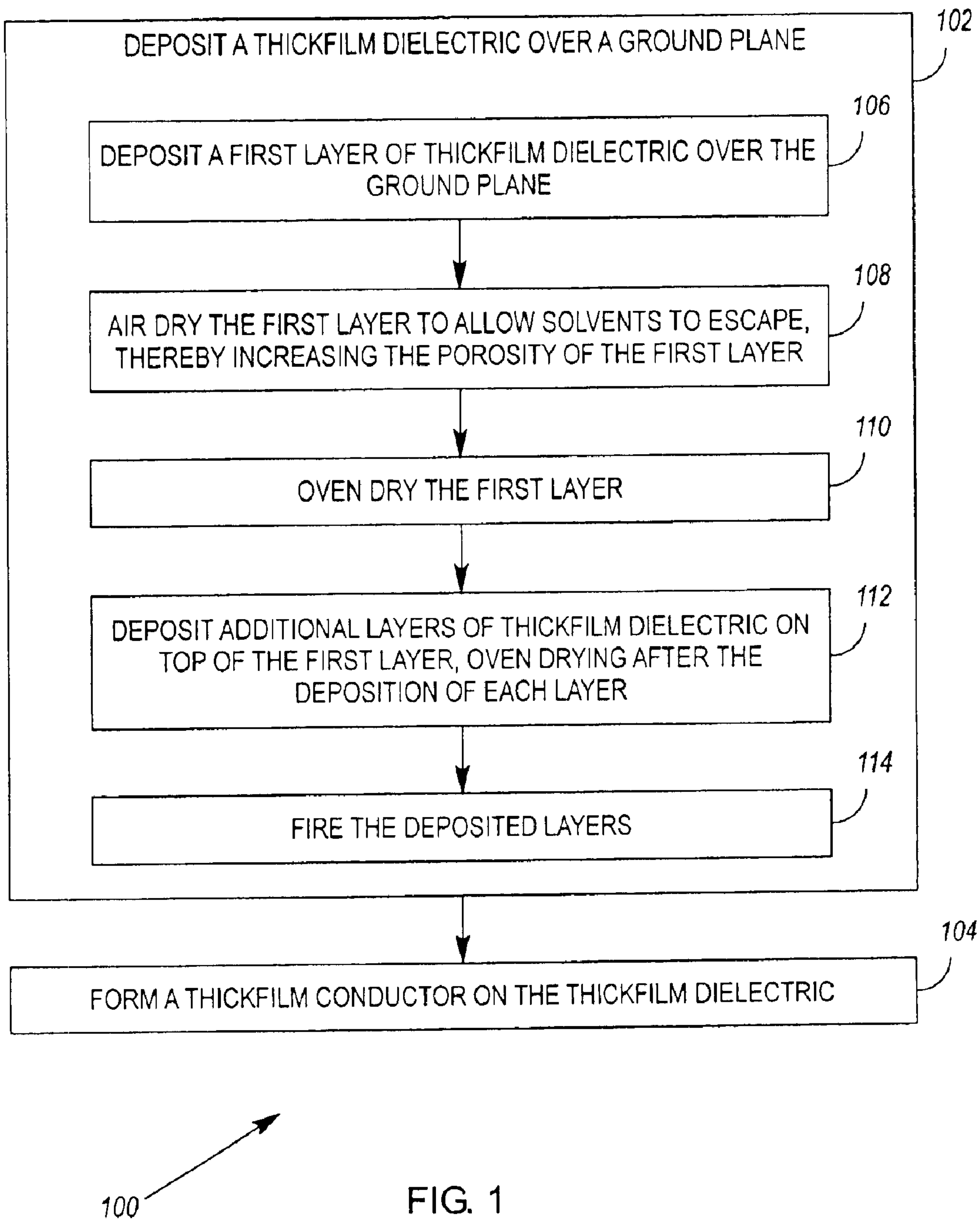
FIG. 1 illustrates a first method for making a microwave circuit.

A first method for making a microwave circuit is illustrated in FIG. 1. In general, the method 100 comprises depositing 102 a thickfilm dielectric over a ground plane, and then forming 104 a conductor on the thickfilm dielectric. The thickfilm dielectric is formed by depositing 106 a first layer of thickfilm dielectric over the substrate, and then air drying 108 the layer to allow solvents to escape, thereby increasing the porosity of the layer. The layer is then oven dried 110 at 150° C. After depositing and drying the first layer, additional layers of thickfilm dielectric are deposited 112 on top of the first layer. After the deposition of each additional layer, including the last layer, the layer is oven dried. After all layers have been deposited and oven dried, the deposited layers are fired 114.

Figure 2:
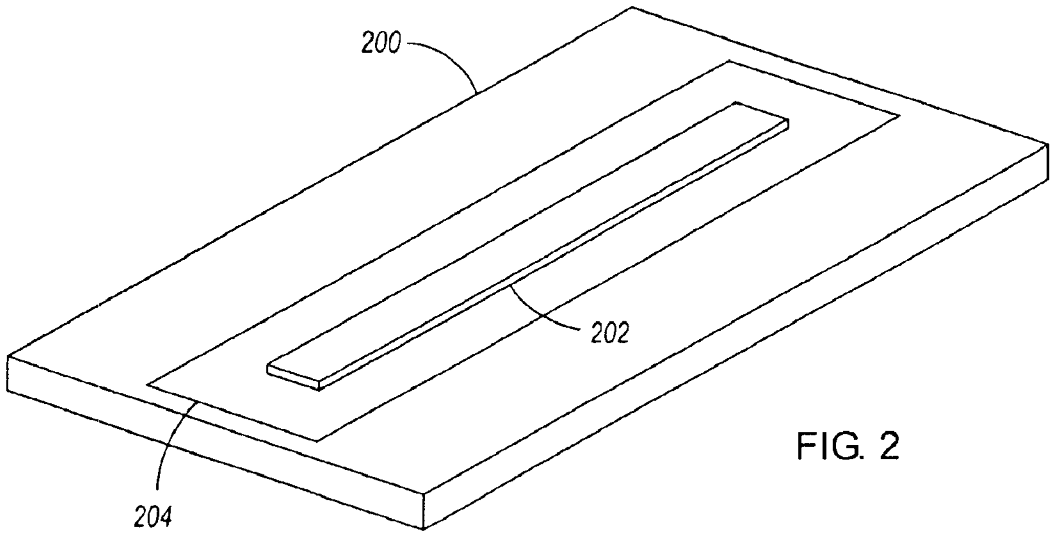
FIG. 2 illustrates a first layer of thickfilm dielectric deposited on a ground plane.
Figure 3:
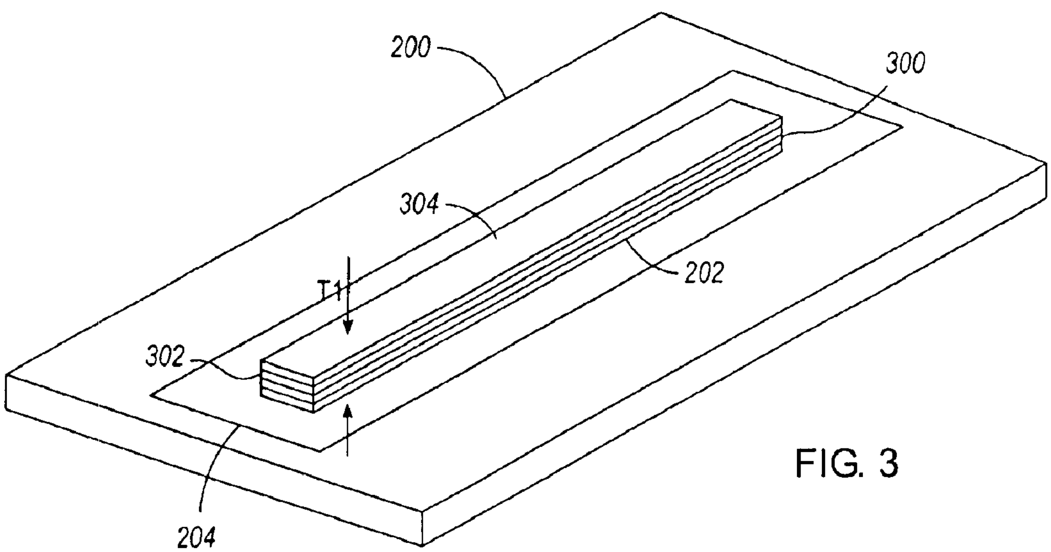
FIG. 3 illustrates additional layers of thickfilm dielectric deposited on the layer of thickfilm dielectric shown in FIG. 2.
Figure 4:
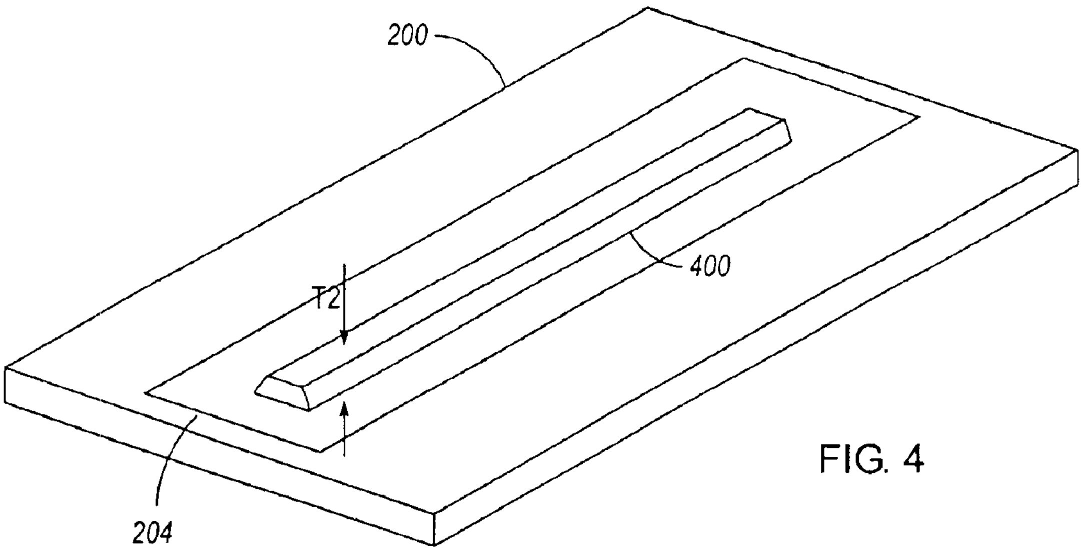
FIG. 4 illustrates the layers of thickfilm dielectric shown in FIG. 3, after firing.

FIGS. 2–4 illustrate an exemplary application of the above method. FIG. 2 illustrates a substrate 200 that, by way of example, may be a 40 mil lapped alumina ceramic substrate. The substrate 200 comprises a ground plane 204 on a top surface thereof. However, the ground plane might also be on the bottom surface of the substrate, or even interior to the substrate. For purposes of this description, the phrase "ground plane" is intended to cover ground planes that substantially or completely cover a surface, as well as ground traces that function as ground planes with respect to one or more particular conductors.

In accordance with the FIG. 1 method, a first layer of thickfilm dielectric 202 is deposited over the ground plane 204. In one embodiment, the dielectric 202 is the KQ CL-90-7858 dielectric (a glass dielectric) available from Heraeus Cermalloy (24 Union Hill Road, West Conshohocken, Pa., USA). However, the dielectric 202 may be another dielectric and, particularly, may be another KQ dielectric, glass dielectric, or other dielectric with suitable electrical properties.

KQ CL-90-7858 prints like a standard thickfilm paste; has a dielectric constant of 3.95 (compared with 9.6 for alumina ceramic); has a loss tangent of 2E-4; may be fired in air in a conventional belt furnace at 850° C.; is optically transparent after firing; and is compatible with DuPont QG150 gold (available from DuPont (1007 Market Street, Wilmington, Del., USA)). The low loss and low dielectric constant of KQ CL-90-7858 makes it particularly suitable for building microwave circuits (e.g., microwave transmission lines).

KQ CL-90-7858 may be deposited on a substrate 200/204 via screen printing. In practice, it has been found useful to thin KQ CL-90-7858 to a viscosity of 18.0±2.0 prior to deposition, and then deposit the thinned dielectric by printing it through a stainless steel screen (e.g., 200 mesh, 1.6 mil wire, 0.8 mil emulsion).

If the deposited dielectric layer 202 is immediately oven dried, it tends to crack as it dries. This is believed to be a result of trapped gasses creating abnormal pressures interior to the dielectric layer. It has been discovered, however, that an extended air drying of the dielectric layer allows solvents to escape from the layer, thereby increasing the porosity of the layer. For a first layer of KQ CL-90-7858 dielectric deposited on a gold plated alumina ceramic substrate, and having a dry print thickness of about 1.5 mils, an air dry of at least 45 minutes tends to alleviate cracking when the layer is oven dried. Following air dry, the layer 202 may be subjected to a standard oven dry (e.g., an oven drying at a peak temperature of about 150° C. for about fifteen minutes).

After air drying and oven drying the first layer of thickfilm dielectric 202, additional layers of thickfilm dielectric 300, 302, 304 may be deposited on top of the first (using, for example, the same procedure that is used to deposit the first layer of thickfilm dielectric on the substrate; see FIG. 3). Each successive layer may be subjected to a quick oven dry of about five minutes prior to deposition of the next layer. Given that the first layer of dried but not fired dielectric is likely to be substantially more porous than the substrate 200/204, and given that additional layers of dielectric 300–304, being of like composition, tend to form a bond to one another that is stronger than the bond between the first layer 202 and the substrate 200/204, extended air drying of the additional layers of thickfilm dielectric is typically unnecessary, and can be dispensed with to shorten the manufacturing process.

After all of the layers of thickfilm dielectric 202, 300–304 have been deposited and dried, the layers are fired (see fired dielectric 400, FIG. 4). If the layers comprise KQ CL-90-7858 dielectric, the firing may be performed using a commonly used thickfilm firing cycle (e.g., The layers may be air fired in a conventional belt furnace at a peak temperature of about 850° C. for about 10 minutes dwell at peak. A slow controlled ramp up in temperature may be incorporated in order to adequately outgas and burn off all organic materials. Likewise, a slow controlled ramp down in temperature may be used to prevent substrate breakage.).

During firing, the deposited dielectric layers 202, 300–304 will shrink (i.e., due to solvents and organic binders being burned away). As a result, a desired final dielectric thickness (or "fired print thickness"; T2, FIG. 4) may only be achieved by depositing enough dielectric layers 202, 300–304 to achieve a dry print thickness (T1, FIG. 3) that is greater than the desired final dielectric thickness. By way of example, the aforementioned KQ CL-90-7858 will shrink upon firing to approximately 60% of it's original unfired thickness. Other dielectrics may have greater or lesser shrink factors than this, but the shrink factor will typically be consistent for a given manufacturer's specific product type. Both the dry print thickness and the fired print thickness of the deposited layers may be measured using a drop-gauge micrometer or stylus profilometer.

Since there are limits on how precisely the height of a thickfilm layer may be controlled during deposition of the thickfilm layer, and because the deposition of successive thickfilm layers only multiplies the effects of any thickfilm height fluctuations, it is desirable in some cases to deposit layers of thickfilm dielectric until a dry print thickness (T1) in excess of a desired dry print thickness is achieved. A precise final dielectric thickness (T2) may then be achieved in a variety of ways. One way is to planarize the deposited layers 202, 300–304 to a desired dry print thickness prior to firing the deposited layers and use the known shrink factor to achieve the final result. In this case, a useful equation is "Dry Print Thickness=Fired Print Thickness/Shrink Factor". With care, a simple cutout metal shim pattern may be used to achieve a final thickness of better than +/−0.4 mils for a 10 mil thick dielectric. A more precise, although more expensive, way is to grind the fired layers to a desired final dielectric thickness. With this method, a 10 mil thick dielectric lay can be controlled to better than +/−0.1 mils variation. The ground surface may then be polished to remove any scratches or, if the dielectric is KQ CL-90-7858, the ground dielectric 400 may be refired to smooth the ground surface and edges (i.e., since KQ CL-90-7858 tends to reflow to a small degree when refired).

It should be noted that, for KQ CL-90-7858 dielectric, a dry print thickness of about 11 mils is required to obtain a final (fired) dielectric thickness of about 5 mils when the grinding method is utilized.

Figure 5:
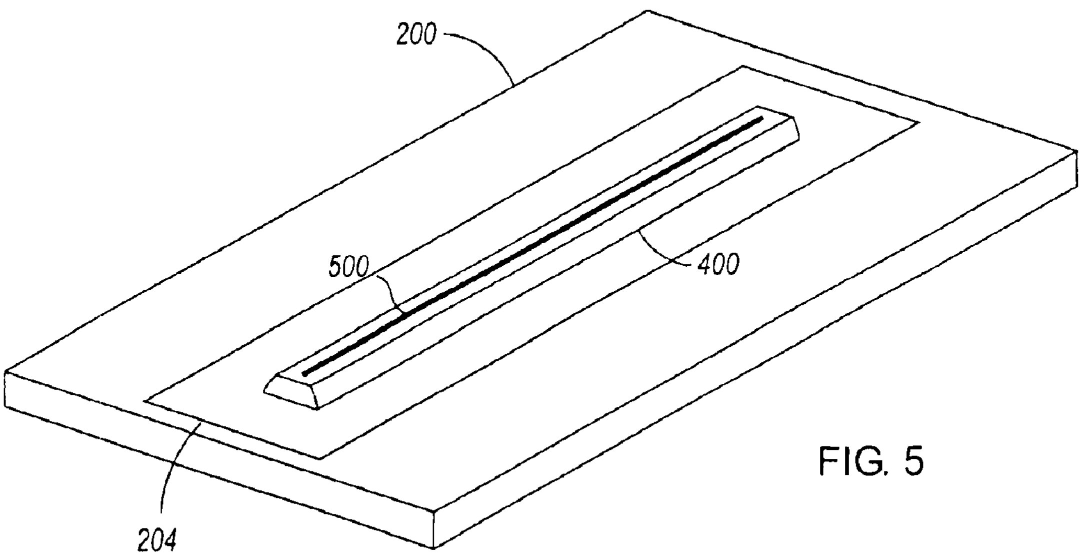
FIG. 5 illustrates a conductor deposited on the thickfilm dielectric shown in FIG. 4.

After depositing the thickfilm dielectric 400 over the ground plane 204, a conductor 500 may be formed on the thickfilm dielectric (see FIG. 5). By way of example, such a conductor may be formed by means of depositing a conductive thickfilm on the dielectric 400 (e.g., via screen printing, stencil printing or doctor blading) and then patterning and etching the conductor in the conductive thickfilm. Alternately, the conductor 500 may be formed as described in the method shown in FIG. 6.

Figure 6:
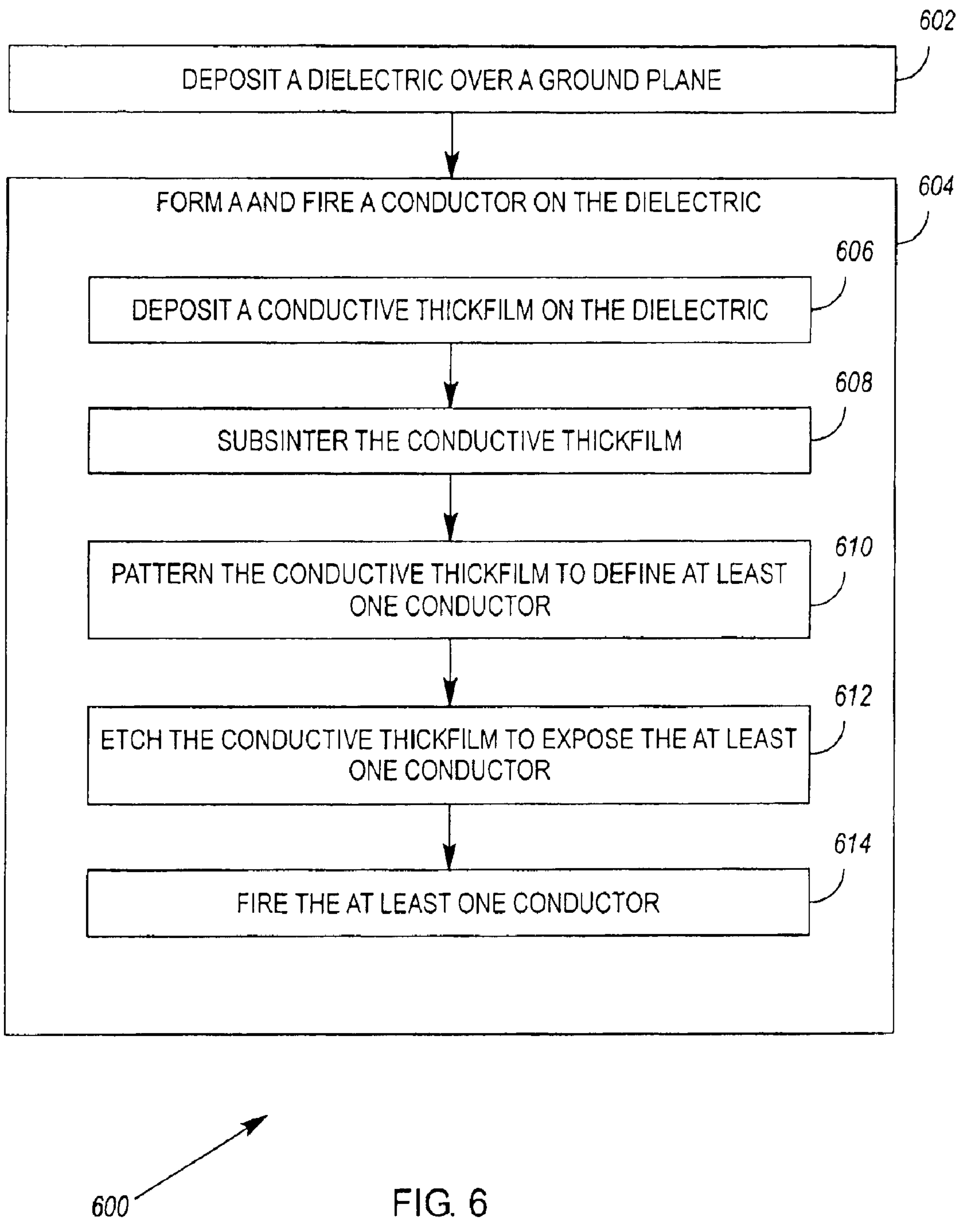
FIG. 6 illustrates a second method for making a microwave circuit.

FIG. 6 illustrates a second method for making a microwave circuit. The method 600 comprises depositing 602 a dielectric over a ground plane, and then forming 604 a conductor on the dielectric.

The conductor is formed on the dielectric by depositing 606 a conductive thickfilm on the dielectric, followed by a "subsintering" 608 of the conductive thickfilm. Subsintering is defined herein as a heating process that is performed at a temperature greater than a mere "drying" temperature of the conductive thickfilm, but at a temperature less than a manufacturer's recommended "firing" temperature for the conductive thickfilm.

When depositing certain conductive thickfilms on certain dielectrics, the conductive thickfilms react with the dielectrics to produce an interface layer that is more difficult to etch than if the same conductive thickfilms are deposited on substrates such as lapped alumina ceramics. It has been discovered, however, that subsintering will produce a conductive thickfilm that can be patterned successfully by chemical etching. The subsintering atmosphere, temperature and time should be sufficient to drive off and burn off unwanted organic materials to form a coherent, but not fully densified, conductive film. The deleterious effects of the aforementioned interface layer are greatly reduced by subsintering.

Subsintering produces a conductive thickfilm layer that is sufficiently resistant to chemical etching to allow good pattern definition while minimizing the extent of the interface layer. The actual formation of the interface layer is determined by complex solid-state diffusion mechanisms which are highly time and temperature dependent. Minimizing the extent of the interface layer allows it to be removed in the same etch process prior to unwanted over-etching of a conductor (or conductors) patterned in the conductive thickfilm.

Either before or after the subsintering, the conductive thickfilm is patterned 610 to define the conductor(s). After the subsintering, the conductive thickfilm is etched 612 to expose the conductor(s). The conductor(s) are then fired 614 at a full sintering temperature.

FIGS. 4 & 7–9 illustrate an exemplary application of the above method. FIG. 4 illustrates a substrate 200 that, by way of example, may be a 40 mil lapped alumina ceramic substrate. A dielectric 400 is deposited on the substrate 200 in any of a variety of configurations and, by way of example, may form a long and narrow plateau having a more or less trapezoidal cross-section. See FIG. 8. In one embodiment, the dielectric is KQ CL-90-7858. However, the dielectric may be another dielectric and, particularly, may be another KQ dielectric, glass dielectric, or other dielectric with suitable electrical properties.

Figure 7:
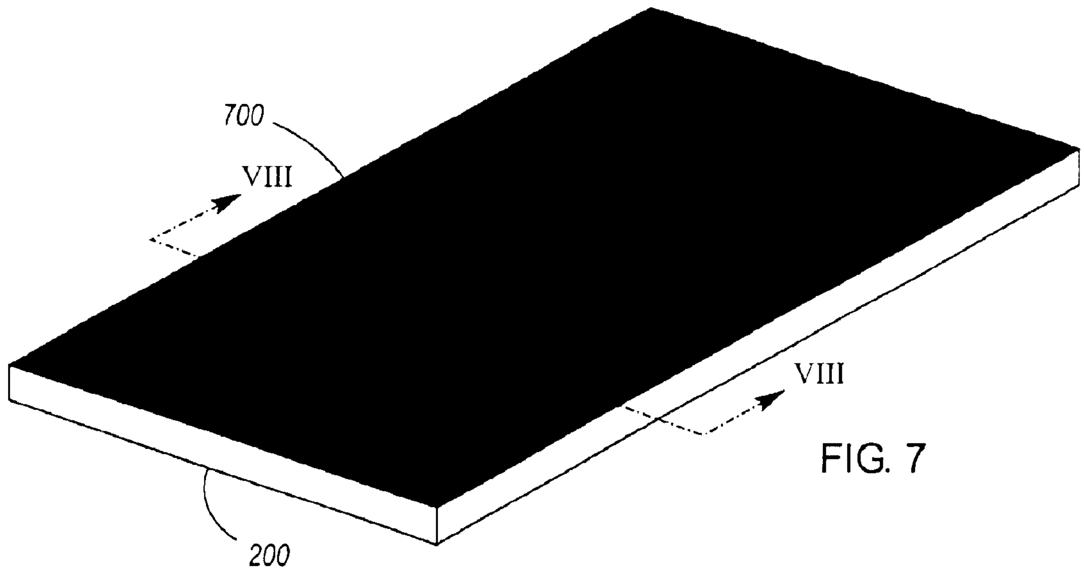
FIG. 7 illustrates the deposition of a conductive thickfilm on a dielectric.
Figure 8:
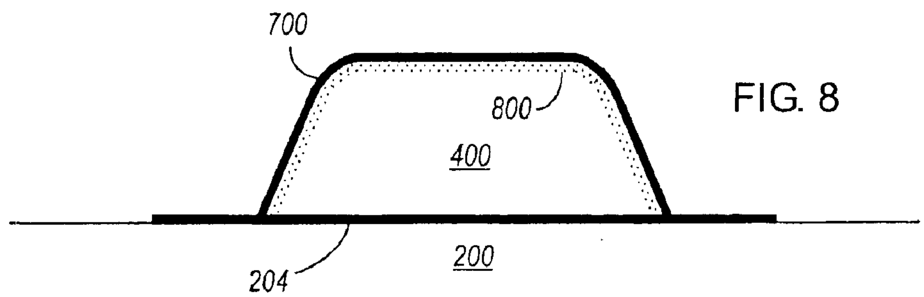
FIG. 8 illustrates a cross-section of FIG. 7.
Figure 9:
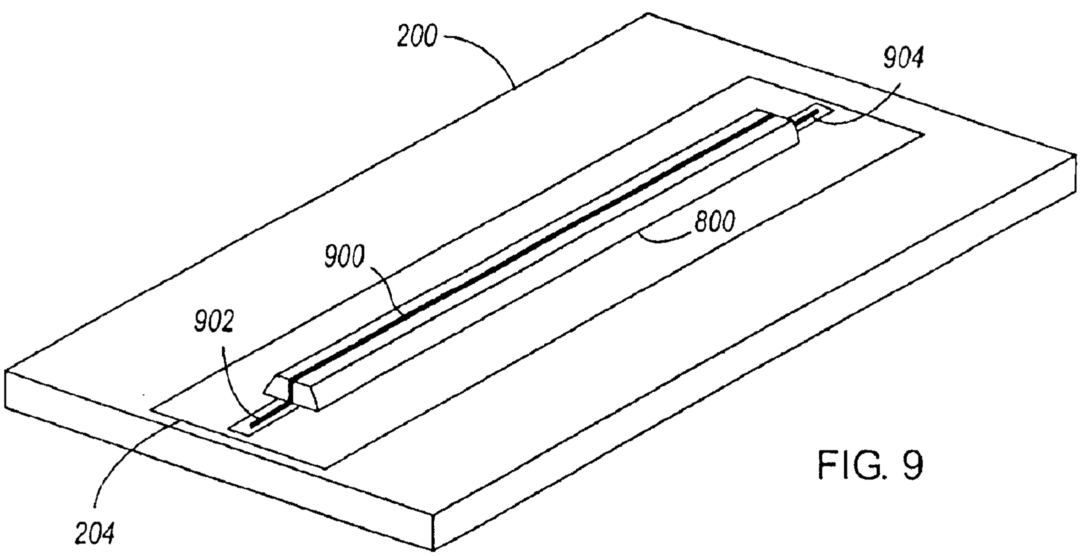
FIG. 9 illustrates the conductive thickfilm of FIGS. 7 & 8 after patterning and etching.

As shown in FIGS. 7 & 8, a conductive thickfilm 700 is deposited on the dielectric 400. The thickfilm 700 may be deposited in a number of ways, including screen printing, stencil printing and doctor blading. In one embodiment, the conductive thickfilm comprises gold, such as DuPont QG150.

The conductive thickfilm 700 may be deposited solely on the dielectric 400 or, as shown in FIG. 7, may be deposited over portions of both the dielectric 400 and the substrate 200. As previously mentioned, some conductive thickfilms react with the dielectrics on which they are deposited, thereby producing an interface layer 800 between the conductive thickfilm 700 and dielectric 400 that is more difficult to etch than if the same conductive thickfilm were deposited on a substrate such as a lapped alumina ceramic substrate. Such an interface layer 800 is formed when DuPont QG150 is deposited on KQ CL-90-7858. This interface layer 800 is best seen in FIG. 8, which shows a cross-section of the dielectric 400 and conductive thickfilm 700 shown in FIG. 7.

If conductors are patterned and etched in DuPont QG150 immediately after it is deposited on KQ CL-90-7858, the time required to etch the interface layer 800 may be long enough that unwanted etching of the patterned conductors occurs. That is, the etch time may be long enough that walls and edges of patterned conductors begin to erode, possibly changing the desired impedance of the conductors. The effects of unwanted conductor etch are compounded when A) a conductive thickfilm 700 is deposited over two or more different materials, and B) the conductive thickfilm tends to etch more quickly over one of the materials. For example, DuPont QG150 deposited on an alumina ceramic substrate etches more quickly than DuPont QG150 deposited on KQ CL-90-7858.

The problems mentioned in the above paragraph may be mitigated by "subsintering" the conductive thickfilm 700 prior to etch. As previously mentioned, subsintering is a heating process that is performed at a temperature greater than a mere "drying" temperature of the conductive thickfilm, but at a temperature less than a manufacturer's recommended "firing" temperature for the conductive thickfilm. For DuPont QG150 deposited on KQ CL-90-7858, subsintering at a peak temperature between 725° C. and 850° C. has been found to be effective, and subsintering at a peak temperature of about 725° C. for about ten minutes has been found to be most effective.

After the conductive thickfilm 700 is subsintered, it is sufficiently resistant to chemical etching, thereby allowing the interface layer 800 to be etched prior to unwanted over-etching of any conductors 900, 902, 904 that are patterned in the conductive thickfilm 700. Subsintering at an appropriate time and temperature also helps to equalize the etch rates of a conductive thickfilm deposited on two different materials (e.g., alumina ceramic and KQ CL-90-7858).

Conductors 900–904 may be patterned in the conductive thickfilm 700 before or after subsintering and, after subsintering, the conductive thickfilm 700 may be etched (e.g., chemically etched) to expose the conductor(s). See FIG. 9. After etch and any necessary cleaning (e.g., washing or rinsing), the exposed conductors 900–904 are fired. For DuPont QG150 conductors, firing may be undertaken at a peak temperature of about 850° C.

Figure 10:
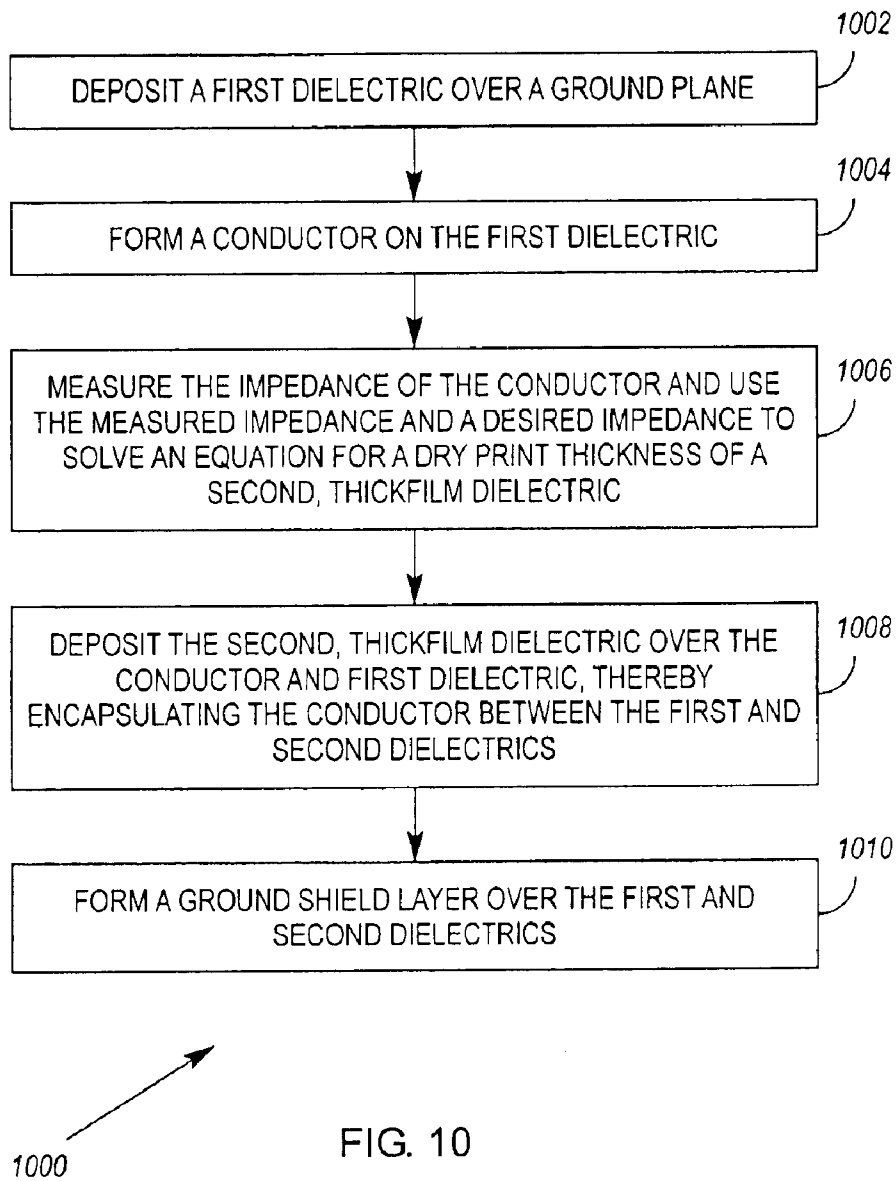
FIG. 10 illustrates a third method for making a microwave circuit.
Figure 11:
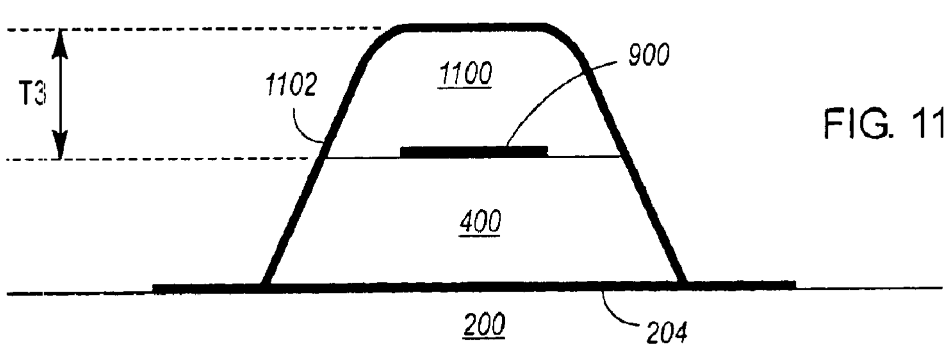
FIG. 11 illustrates a conductor encapsulated between first and second dielectrics.

FIG. 10 illustrates yet another method for making a microwave circuit. The method 1000 commences with the deposition 1002 of a first dielectric 400 over a ground plane 204, followed by the formation 1004 of a conductor 900 on the dielectric 400 (FIG. 11). The first dielectric and conductor may be thickfilms (and possibly multi-layer thickfilms), but need not be.

Following deposition of the first dielectric and conductor, the impedance of the conductor 900 is measured 1006, and the measured impedance and a desired impedance are used to solve for a dry print thickness (T3, FIG. 11) of a second, thickfilm dielectric. The second, thickfilm dielectric 1100 is then deposited 1008 over the conductor 900 and first dielectric 400, thereby encapsulating the conductor 900 between the first and second dielectrics 400, 1100. A ground shield layer 1102 is then formed 1010 over the first and second dielectrics. Optionally, the ground shield layer 1102 may be conductively coupled to the ground plane 204.

In one embodiment of the FIG. 10 method, the first and second dielectrics are thickfilm dielectrics that are deposited in accordance with the FIG. 1 method, and the conductor is a thickfilm conductor deposited in accordance with the FIG. 6 method.

Figure 12:
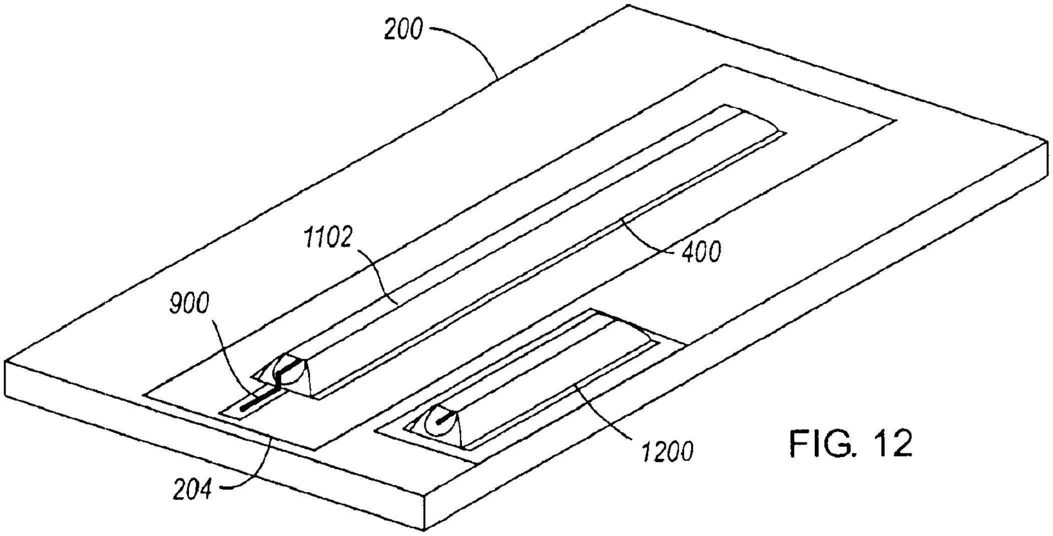
FIG. 12 illustrates a test structure formed alongside a microwave circuit.

The impedance of the conductor 900 may be measured by means of time domain reflectometry. Although the impedance of the conductor on the actual circuit may be measured from the conductor itself, the configuration of the conductor or surrounding conductors may be such that a direct measurement of the conductor's impedance is difficult. Or, for example, the different placements of conductors on different devices may make it difficult for an impedance measuring device to measure the impedance of different configurations of conductors. It may therefore be beneficial to form a test structure 1200 at the same time as the microwave circuit, using the same process used to form the microwave circuit, and then measure the impedance of the test structure 1200 and presume that the impedance of the conductor 900 is the same. Such a test structure is shown in FIG. 12.

If the measured impedance of the conductor 900 is less than a desired impedance, the fired print thickness of the second thickfilm dielectric 1100 should be made thicker than the fired print thickness of the first thickfilm dielectric 400. Likewise, if the measured impedance is greater than the desired impedance, the fired print thickness of the second thickfilm dielectric 1100 should be made thinner than the fired print thickness of the first thickfilm dielectric 400. In general, the thickness of the second dielectric 1100 may be adjusted by two times the percentage deviation of the measured impedance from the desired impedance. The appropriate "dry print" thickness for the second dielectric 1100 may then be determined by the aforementioned considerations of shrink factor, and whether or not the more precise thickness grinding method will be used. An electromagnetic field-solver software program may be used to determine the required fired print thickness. Two such programs are "HFSS—High Frequency Structure Simulator", a full 3 dimensional UNIX-based program available from Agilent Technologies (395 Page Mill Road, Palo Alto, Calif., USA), and "Si8000" available from Polar Instruments (320 East Bellevue Avenue, San Mateo, Calif., USA).

Figure 13:
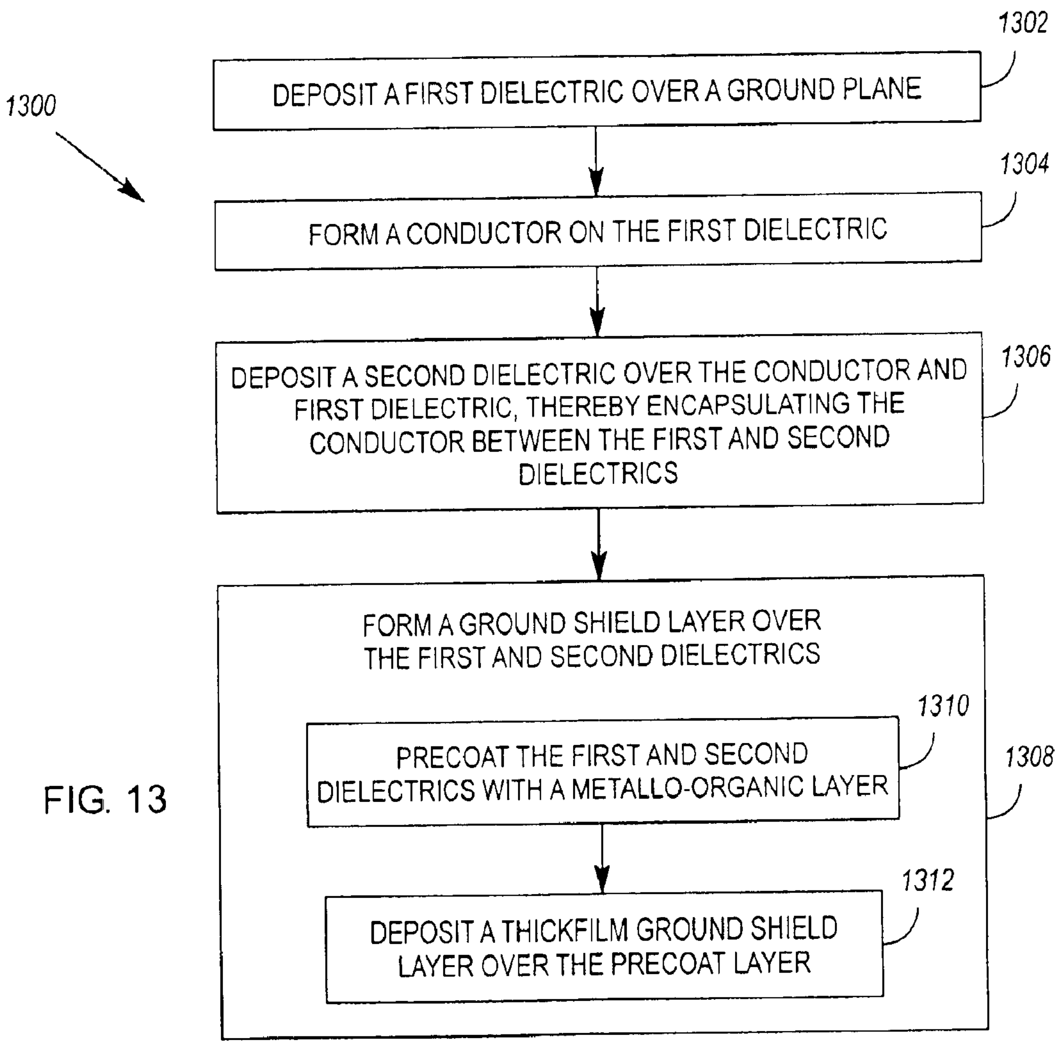
FIG. 13 illustrates a fourth method for making a microwave circuit.

FIG. 13 illustrates a fourth method for making a microwave circuit. As in the method of FIG. 10, the method 1300 commences with the deposition 1302 of a first dielectric 400 over a ground plane 204, followed by the formation 1304 of a conductor 900 on the dielectric 400 (FIG. 11). A second dielectric 1100 is then deposited 1300 over the conductor 900 and first dielectric 400, thereby encapsulating the conductor between the first and second dielectrics. The first and second dielectrics, as well as the conductor, may be thickfilms (and possibly multi-layer thickfilms), but need not be.

Figure 14:
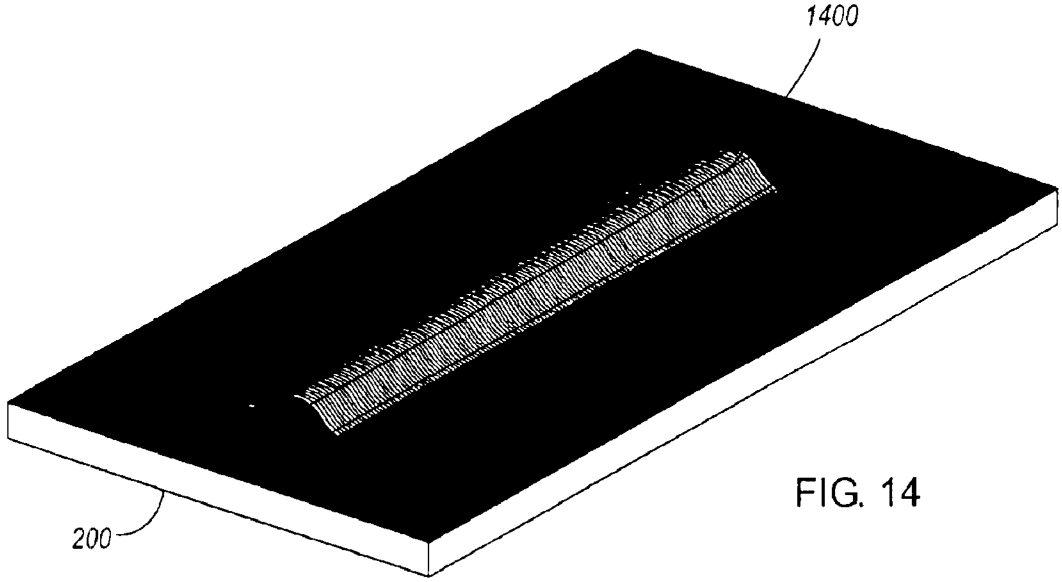
FIG. 14 illustrates the placement of a polymer screen over first and second dielectrics.

After deposition of the dielectrics 400, 1100 and conductor 900, a ground shield layer 1102 is formed 1308 over the first and second dielectrics 400, 1100, and may be conductively coupled to the ground plane 204. The ground shield layer 1102 may be formed by 1) precoating 1310 the first and second dielectrics with a metallo-organic layer (such as ESL 8081-A available from Electro-Science Laboratories, Inc. (416 East Church Road, King of Prussia, Pa., USA)), and then 2) depositing 1312 a thickfilm ground shield layer over the precoat layer. The ground shield layer 1102 may be deposited over the precoat layer by placing a polymer screen 1400 (FIG. 14) over the dielectrics 400, 1100, and applying pressure to the polymer screen until it at least partially conforms to a contour of the dielectrics. The thickfilm ground shield layer 1102 may then be printed through the polymer screen 1400.

In one embodiment of the FIG. 13 method, the first and second dielectrics are thickfilm dielectrics that are deposited in accordance with the FIG. 1 method, and the conductor is a thickfilm conductor deposited in accordance with the FIG. 6 method.

The FIG. 13 method may further comprise measuring the impedance of the conductor 900 prior to depositing a second, thickfilm dielectric, and using the measured impedance and a desired impedance to solve an equation for a dry print thickness of the second, thickfilm dielectric.

Figure 16:
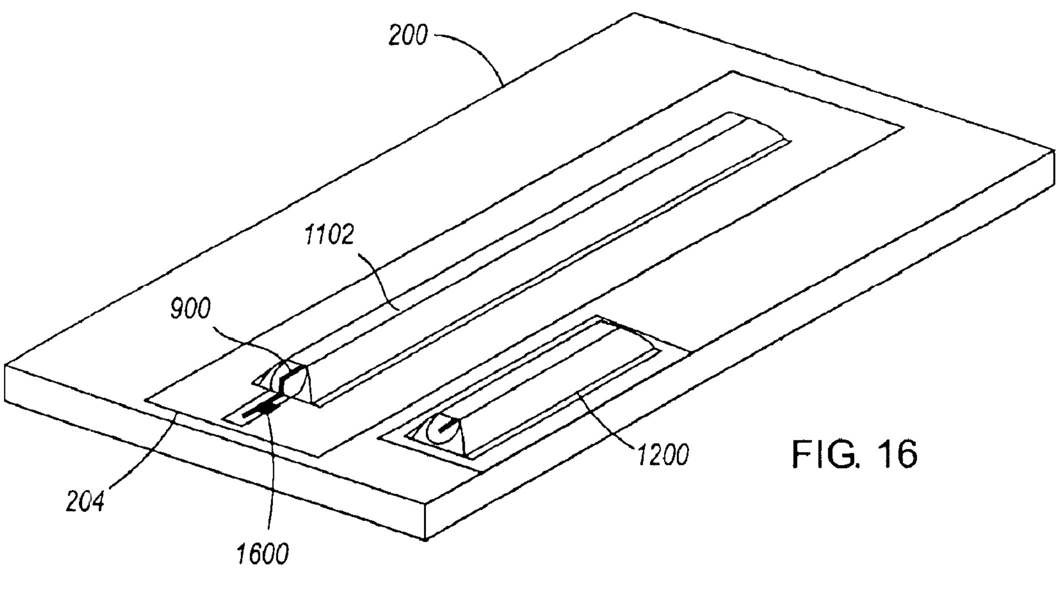
FIG. 16 illustrates a thickfilm resistor deposited in close proximity to a microwave circuit.
Figure 15:
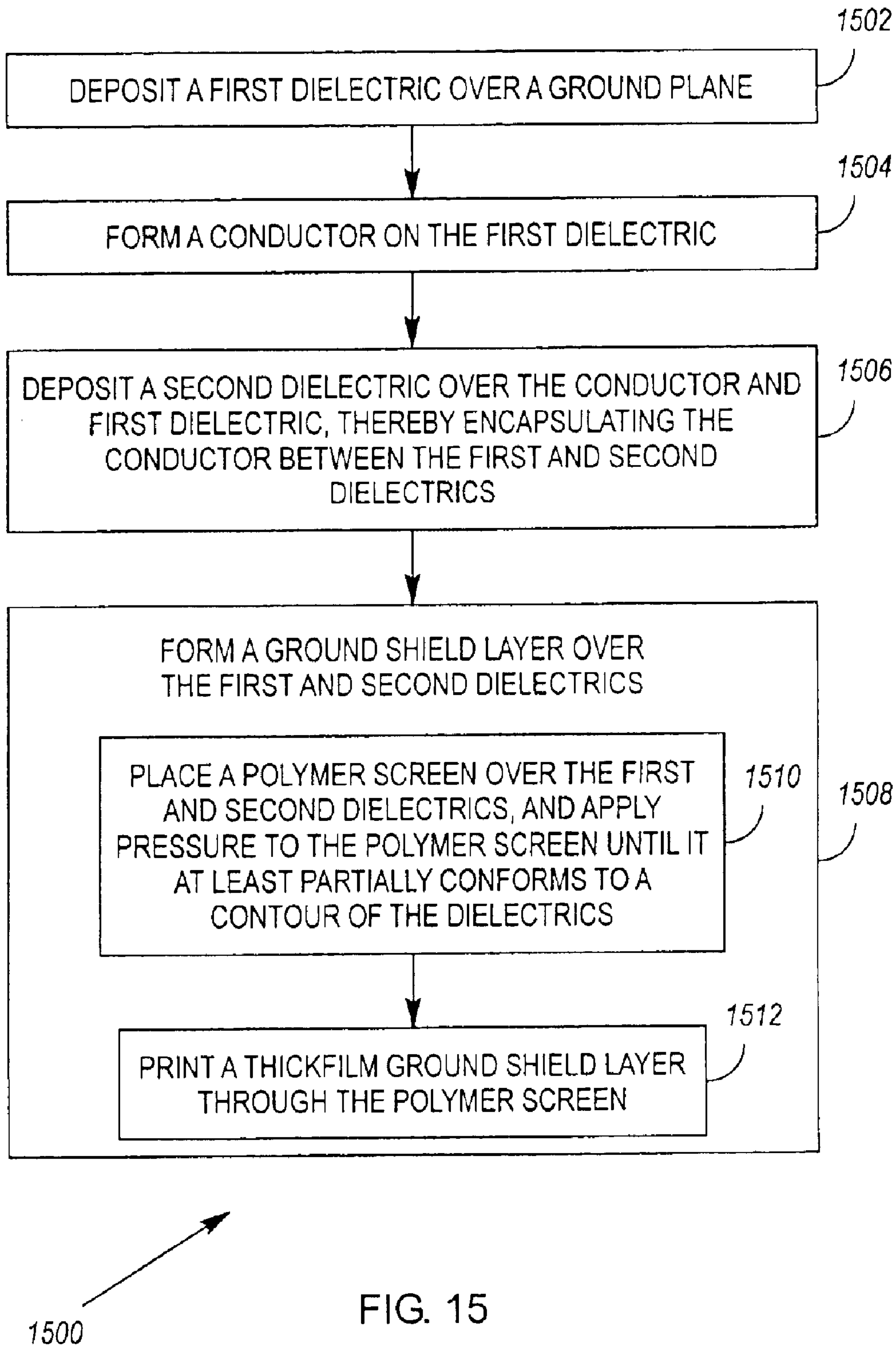
FIG. 15 illustrates a fifth method for making a microwave circuit.

FIG. 15 illustrates a fifth method for making a microwave circuit. The method 1500 commences with the deposition 1502 of a first dielectric over a ground plane 204, followed by the formation 1504 of a conductor 900 on the dielectric (FIG. 16). A second dielectric is then deposited 1506 over the conductor and first dielectric, thereby encapsulating the conductor between the first and second dielectrics. The first and second dielectrics, as well as the conductor, may be thickfilms (and possibly multi-layer thickfilms), but need not be.

After deposition of the dielectrics and conductor, a ground shield layer 1102 is formed 1508 over the first and second dielectrics. The ground shield layer may be deposited by placing 1510 a polymer screen 1400 (FIG. 14) over the dielectrics and applying pressure to the polymer screen until it at least partially conforms to a contour of the dielectrics. The thickfilm ground shield layer 1102 may then be printed through the polymer screen 1400.

In one embodiment of the FIG. 15 method, the first and second dielectrics are thickfilm dielectrics that are deposited in accordance with the FIG. 1 method, and the conductor is a thickfilm conductor deposited in accordance with the FIG. 6 method.

The FIG. 15 method may further comprise, prior to depositing a second, thickfilm dielectric, measuring the impedance of the conductor 900 and using the measured impedance and a desired impedance to solve an equation for a dry print thickness of the second, thickfilm dielectric.

As previously mentioned, any or all of the methods shown in FIGS. 1, 6, 10, 13 & 15 may be combined. Further, any of the methods may additionally comprise forming a thickfilm resistor 1600 near the dielectric(s) by 1) placing a polymer screen over the dielectric(s), 2) applying pressure to the polymer screen until it at least partially conforms to a contour of the dielectric(s), and then 3) printing the thickfilm resistor 1600 through the polymer screen. See FIG. 16, which shows the thickfilm resistor 1600, but not the polymer screen through which it is printed. The polymer screen would be similar to the screen 1400 shown in FIG. 1, but with a different reveal.

Although polymer screens have been largely replaced by stainless steel screens in today's manufacturing processes, a polymer screen is especially useful in printing ground shield layers or thickfilm resistors on/near raised dielectrics in that pressure can be applied to a polymer screen to make it conform somewhat to the contours of the dielectrics, thus mitigating the thickness and misalignment concerns associated with printing a ground shield layer of thickfilm resistor through a screen that does not sit flush (or at least close) to the surface on which the ground shield layer or thickfilm resistor is to be printed. Although a thickfilm resistor could also be printed prior to laying down steep dielectrics (that is, steep in relevant terms), doing so may subject the resistor to repeated firings at high temperatures, thereby causing the value of the resistor to drift unacceptably from its intended value.

As one of ordinary skill in the art will understand after reading the above description, the methods shown in FIGS. 1, 6, 10, 13 & 15 may be used to construct transmission lines as microstrips, striplines, coplanar coaxial lines, and/or quasi-coaxial lines (i.e., coaxial lines but for their lack of cross-sectional symmetry). The transmission lines may be made as thin and narrow as manufacturing processes allow, with the caveat that thinner and narrower dielectrics result in narrower conductors, and thus more conductor loss.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for making a microwave circuit, comprising:

a) depositing a first dielectric over a ground plane;

b) forming a conductor on the first dielectric;

c) measuring the impedance of the conductor, and using the measured impedance and a desired impedance to solve an equation for a dry print thickness of a second, thickfilm dielectric;

d) depositing the second, thickfilm dielectric over the conductor and first dielectric, thereby encapsulating the conductor between the first and second dielectrics; and e) forming a ground shield layer over the first and second dielectrics.

2. The method of claim 1, wherein the impedance measurement is performed using time domain reflectometry.

3. The method of claim 1, wherein the impedance measurement is performed on a test structure formed in parallel with the microwave circuit, using the same process used to form the microwave circuit.

4. The method of claim 1, wherein the first dielectric is a thickfilm dielectric.

5. The method of claim 4, wherein:

a) if the measured impedance of the conductor is less than the desired impedance, the dry print thickness of the second thickfilm dielectric is thicker than a dry print thickness of the first thickfilm dielectric; and b) if the measured impedance is greater than the desired impedance, the dry print thickness of the second thickfilm dielectric is thinner than a dry print thickness of the first thickfilm dielectric.

6. The method of claim 1, further comprising, conductively coupling the ground shield layer to the ground plane.

7. The method of claim 1, wherein at least one of the first and second dielectrics is deposited by, a) depositing a first layer of thickfilm dielectric over the ground plane;

b) air drying the first layer to allow solvents to escape, thereby increasing the porosity of the first layer;

c) oven drying the first layer;

d) depositing additional layers of thickfilm dielectric on top of the first layer, oven drying after the deposition of each additional layer; and e) firing the deposited layers.

8. The method of claim 1, further comprising forming a thickfilm resistor near the dielectrics by, a) placing a polymer screen over the dielectrics, and applying pressure to the polymer screen until it at least partially conforms to a contour of the dielectrics; and b) printing the thickfilm resistor through the polymer screen.

* * * * *